(12) United States Patent
Jeong et al.

(10) Patent No.: US 8,885,424 B2
(45) Date of Patent: Nov. 11, 2014

(54) INTEGRATED CIRCUIT AND MEMORY DEVICE

(71) Applicant: SK Hynix Inc., Gyeonggi-do (KR)

(72) Inventors: Jeongsu Jeong, San Jose, CA (US);
Youncheul Kim, San Jose, CA (US);
Hyunsu Yoon, Gyeonggi-do (KR);
Yonggu Kang, Gyeonggi-do (KR);
Kwidong Kim, Gyeonggi-do (KR);
Jeongtae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 13/672,140

(22) Filed: Nov. 8, 2012

(65) Prior Publication Data

US 2014/0126308 A1    May 8, 2014

(51) Int. Cl.
*G11C 7/10* (2006.01)

(52) U.S. Cl.
USPC ..................... 365/200; 365/189.12

(58) Field of Classification Search
USPC ........................... 365/189.12, 200
See application file for complete search history.

(56) References Cited

U.S. PATENT DOCUMENTS

| | | | |
|---|---|---|---|
| 6,667,902 B2 | 12/2003 | Peng | |
| 6,777,757 B2 | 8/2004 | Peng et al. | |
| 6,904,751 B2 | 6/2005 | Makki et al. | |
| 7,173,851 B1 | 2/2007 | Callahan et al. | |
| 7,269,047 B1 | 9/2007 | Fong et al. | |
| 2012/0230136 A1* | 9/2012 | Gorman et al. | 365/200 |

* cited by examiner

*Primary Examiner* — Hoai V Ho
(74) *Attorney, Agent, or Firm* — IP & T Group LLP

(57) ABSTRACT

A memory device includes a boot-up control unit configured to control a start of boot-up operation by starting the boot-up operation when an initialization signal is activated, and ignore the initialization signal after a complete signal is activated, a nonvolatile memory unit configured to store repair data, and output the stored repair data during the boot-up operation, a plurality of registers configured to store the repair data outputted from the nonvolatile memory unit, a plurality of memory banks configured to replace a normal cell with a redundant cell, using the repair data stored in the corresponding registers among the plurality of resistors, and a verification unit configured to generate the complete signal to notify that the boot-up operation is completed.

13 Claims, 6 Drawing Sheets

INTEGRATED CIRCUIT AND MEMORY DEVICE

BACKGROUND

1. Field

Exemplary embodiments of the present invention relate to an integrated circuit and a memory device, and more particularly, to a technology for transmitting data stored in a nonvolatile memory in an integrated circuit or memory device to numerous parts of the integrated circuit or memory device.

2. Description of the Related Art

FIG. 1 is a diagram for illustrating a repair operation of a conventional memory device.

Referring to FIG. 1, the conventional memory device includes a cell array 110, a row circuit 120, and a column circuit 130. The cell array 110 includes a plurality of memory cells. The row circuit 120 is configured to enable a word line selected by a row address R_ADD. The column circuit 130 is configured to access (read or write) data of a bit line selected by a column address C_ADD.

A row fuse circuit 140 is configured to store a row address, corresponding to a memory cell having a defect in the cell array 110, and generate a repair row address REPAIR_R_ADD. A row comparison unit 150 is configured to compare the repair row address REPAIR_R_ADD stored in the row fuse circuit 140 to the row address R_ADD inputted from an external source. When the repair row address REPAIR_R_ADD coincides with the row address R_ADD, the row comparison unit 150 controls the row circuit 120 to enable a redundant word line instead of the word line designated by the row address R_ADD.

A column fuse circuit 160 is configured to store a column address, corresponding to a memory cell having a defect in the cell array 110, and generate a repair column address REPAIR_C_ADD. A column comparison unit 170 is configured to compare the repair column address REPAIR_C_ADD from the column fuse circuit 160 to the column address C_ADD inputted from an external source. When the repair column address REPAIR_C_ADD coincides with the column address C_ADD, the column comparison unit 170 controls the column circuit 130 to access a redundant bit line, instead of the bit line is designated by the column address C_ADD.

The row fuse circuit 140 and the column fuse circuit 160 (hereinafter referred to as the fuse circuits) of FIG. 1 use laser fuses. The laser fuse stores high or low data depending on whether the fuse is cut or not. The laser fuse may be programmed in a wafer state, but may not be programmed after the wafer is mounted in a package. Furthermore, the laser fuse may not be designed small, because of a pitch limit. To overcome such a design difficulty, an E-fuse may be used. The E-fuse may include a transistor or capacitor and/or resistor. When the E-fuse includes a transistor, the E-fuse stores data by changing resistance between a gate and a drain/source.

FIG. 2 is a diagram illustrating that the E-fuse including a transistor operates as a resistor or capacitor.

Referring to FIG. 2, the E-fuse includes a transistor T. When a normal power supply voltage, which the transistor T may tolerate, is supplied to a gate G, the E-fuse operates as a capacitor C. Therefore, there is no current flowing between the gate G and a drain D or source S (hereinafter referred to as a drain-source D-S). However, when a high voltage, which the transistor T may not tolerate, is supplied to the gate G, gate oxide of the transistor T may become inoperable to short the gate G and the drain-source D-S. In this case, the E-fuse operates as a resistor R. Therefore, a current flows between the gate G and the drain-source D-S.

Such a characteristic may be used to recognize the data of the E-fuse through the resistance value between the gate G and the drain-source D-S of the E-fuse. To recognize the data of the E-fuse, (1) the size of the transistor T may be increased to directly recognize the data without a separate sensing operation, or (2) an amplifier may be used to sense a current flowing in the transistor T without increasing the size of the transistor T. In the above-described two methods, however, the transistor T forming the E-fuse must be enlarged, or the amplifier for amplifying data must be provided for each E-fuse. Therefore, both methods have limitations and concerns over the size and space.

Because of the above-described concerns related to the size and space, it may not be easy to apply the E-fuse to the fuse circuits 140 and 160 of FIG. 1. Therefore, as disclosed in U.S. Pat. Nos. 6,904,751, 6,777,757, 6,667,902, 7,173,851, and 7,269,047, researches have been conducted on a method for performing a repair operation using data stored in an E-fuse array including a plurality of E-fuses (in this case, the entire area may be reduced because an amplifier is shared).

To use data (for example, repair information) stored in a nonvolatile memory, such as an E-fuse array, provided in a memory device, a boot-up operation must be performed to transmit the data stored in the E-fuse array to each area of the memory device where the data stored in the E-fuse array is used.

SUMMARY

Exemplary embodiments of the present invention are directed to an efficient scheme for transmitting data stored in an E-fuse array to numerous parts of an integrated circuit or memory device.

Other exemplary embodiments of the present invention are directed to a scheme for deciding a performance period of a boot-up operation.

In accordance with an embodiment of the present invention, a memory device includes a boot-up control unit configured to control a start of boot-up operation by starting the boot-up operation when an initialization signal is activated, and ignore the initialization signal after a complete signal is activated, a nonvolatile memory unit configured to store repair data, and output the stored repair data during the boot-up operation, a plurality of registers configured to store the repair data outputted from the nonvolatile memory unit, a plurality of memory banks configured to replace a normal cell with a redundant cell, using the repair data stored in the corresponding registers among the plurality of resistors, and a verification unit configured to generate the complete signal to notify that the boot-up operation is completed.

In accordance with another embodiment of the present invention, a memory device includes a boot-up control unit configured to control a start of boot-up operation by starting the boot-up operation when an initialization signal is activated, and ignore the initialization signal after a setting command is activated, a nonvolatile memory unit configured to store repair data, and output the stored repair data during the boot-up operation, a plurality of registers configured to store the repair data outputted from the nonvolatile memory unit, and a plurality of memory banks configured to replace a normal cell with a redundant cell, using the repair data stored in the corresponding registers among the plurality of registers.

In accordance with yet another embodiment of the present invention, an integrated circuit includes a boot-up control unit configured to control a start of boot-up operation by starting the boot-up operation when an initialization signal is activated, and ignore the initialization signal after a complete signal is activated, a nonvolatile memory unit configured to output data stored therein during the boot-up operation, a plurality of registers configured to store the data outputted from the nonvolatile memory unit, an internal circuit configured to use the data stored in the plurality of registers, and a verification unit configured to generate the complete signal to notify that the boot-up operation is completed.

DETAILED DESCRIPTION

Figure 1:
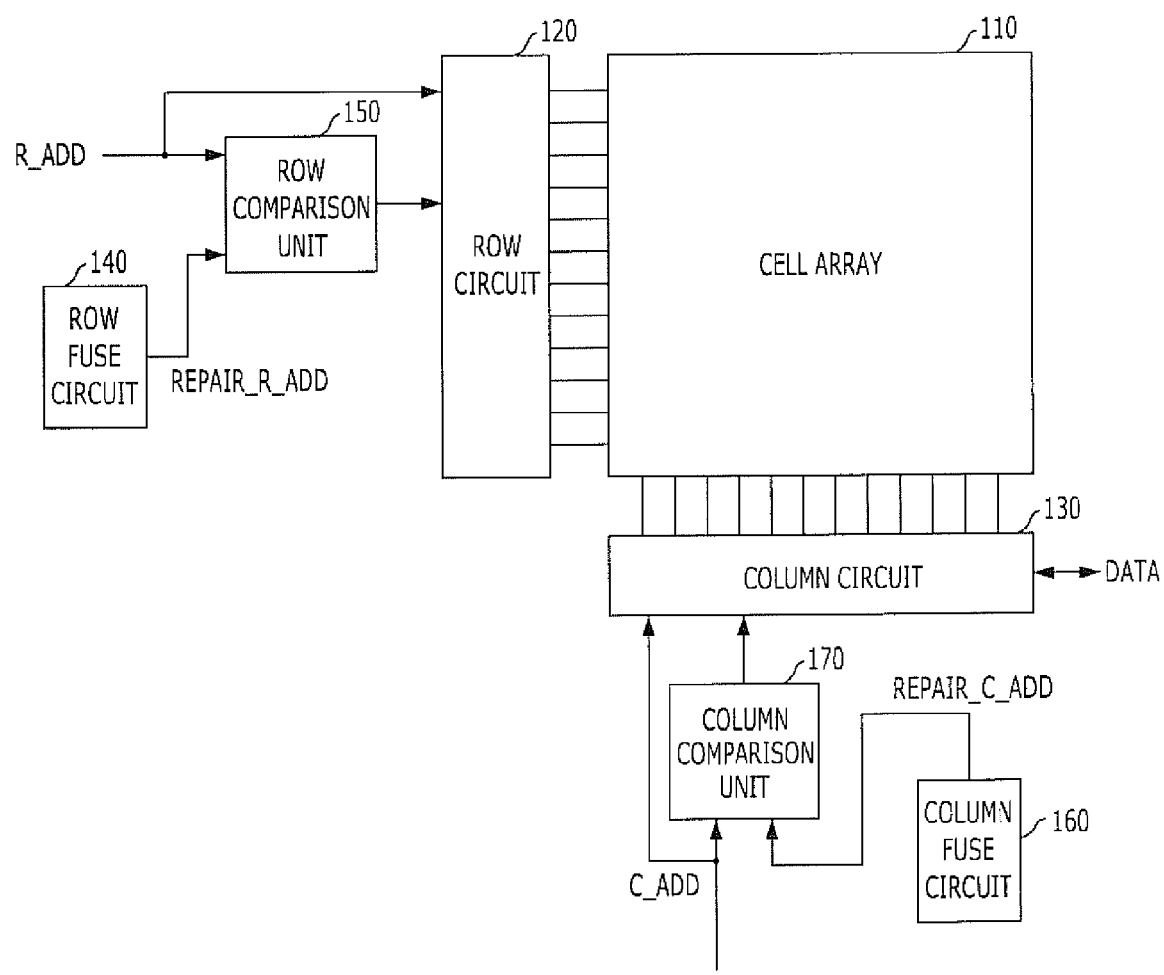
FIG. 1 is a diagram for illustrating a repair operation of a conventional memory device.
Figure 2:
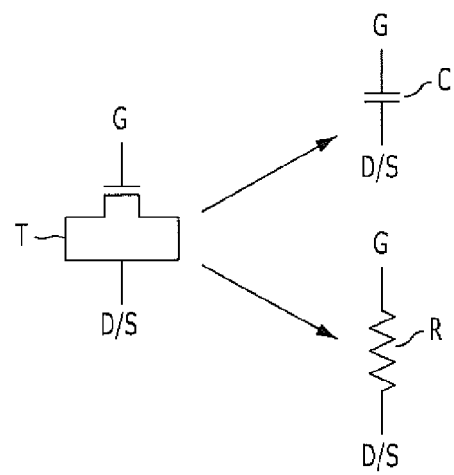
FIG. 2 is a diagram illustrating that an E-fuse including a transistor operates as a resistor or capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
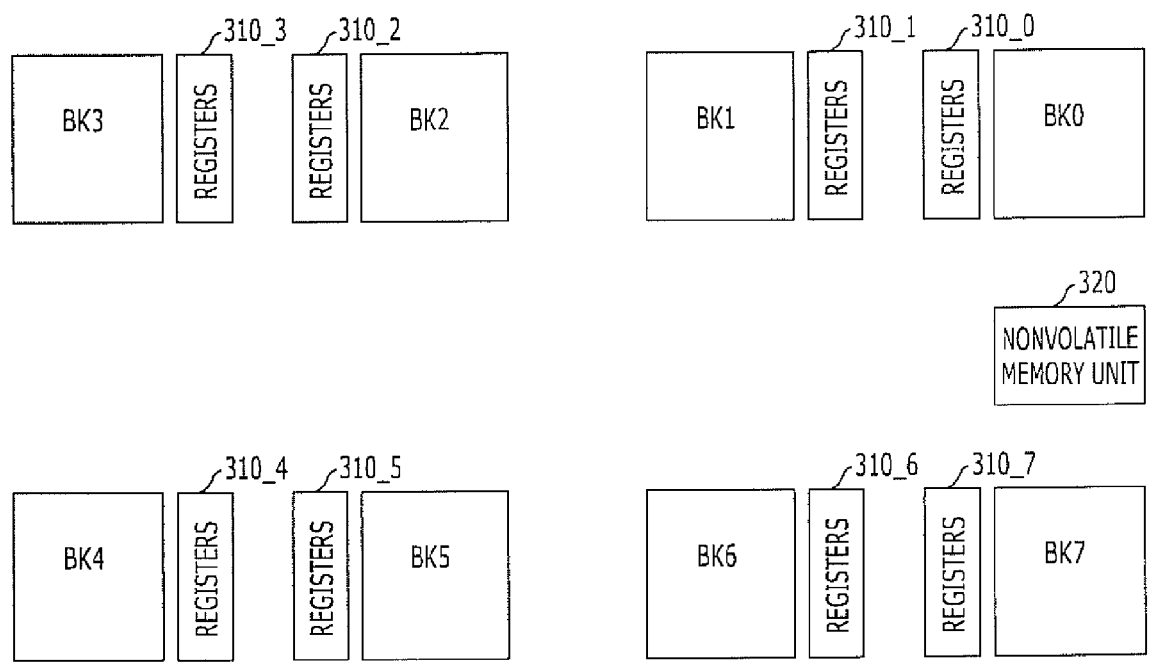
FIG. 3 illustrates a nonvolatile memory unit that stores repair information in a memory device.

FIG. 3 illustrates a nonvolatile memory unit that stores repair information in a memory device.

Referring to FIG. 3, the memory device includes a plurality of memory banks BK0 to BK7, a plurality of registers 310_0 to 310_7 provided in the respective memory banks and configured to store a repair address, and a nonvolatile memory unit 320.

The nonvolatile memory unit 320 substitutes for the conventional fuse circuits 140 and 160 (shown in FIG. 1). Here, the nonvolatile memory unit 320 stores repair information, which includes a repair address, corresponding to all of the banks BK0 to BK7. The nonvolatile memory unit 320 may include an E-fuse array or various nonvolatile memories such as flash memory and Electrically Erasable Programmable Read-Only Memory (EEPROM).

The registers 310_0 to 310_7 provided for the respective banks BK0 to BK7 are configured to store the repair information of the corresponding memory banks BK0 to BK7, respectively. For example, the registers 310_0 store the repair information of the memory bank BK_0, and the registers 310_4 store the repair information of the memory bank BK_4. The registers 310_0 to 310_7 receive and store the repair information from the nonvolatile memory unit 320 of the memory device.

Since the nonvolatile memory unit 320 is configured in an array type, the nonvolatile memory unit 320 requires a predetermined time to call data stored therein. Therefore, it may be difficult to perform a repair operation by directly using the data stored in the nonvolatile memory unit 320. Therefore, a boot-up operation is necessarily required to transmit the information stored in the nonvolatile memory unit 320 to the respective registers 310_0 to 310_7. After the boot-up operation, the data stored in the registers 310_0 to 310_7 may be used in the repair operation.

In order for the nonvolatile memory unit 320 to transmit data to the registers 310_0 to 310_7, an address for designating registers among the registers 310_0 to 310_7 must be transmitted together with the data to be stored in the registers 310_0 to 310_7. Hereafter, a scheme for simplifying the data transmission and when to start the boot-up operation will be described.

Figure 4:
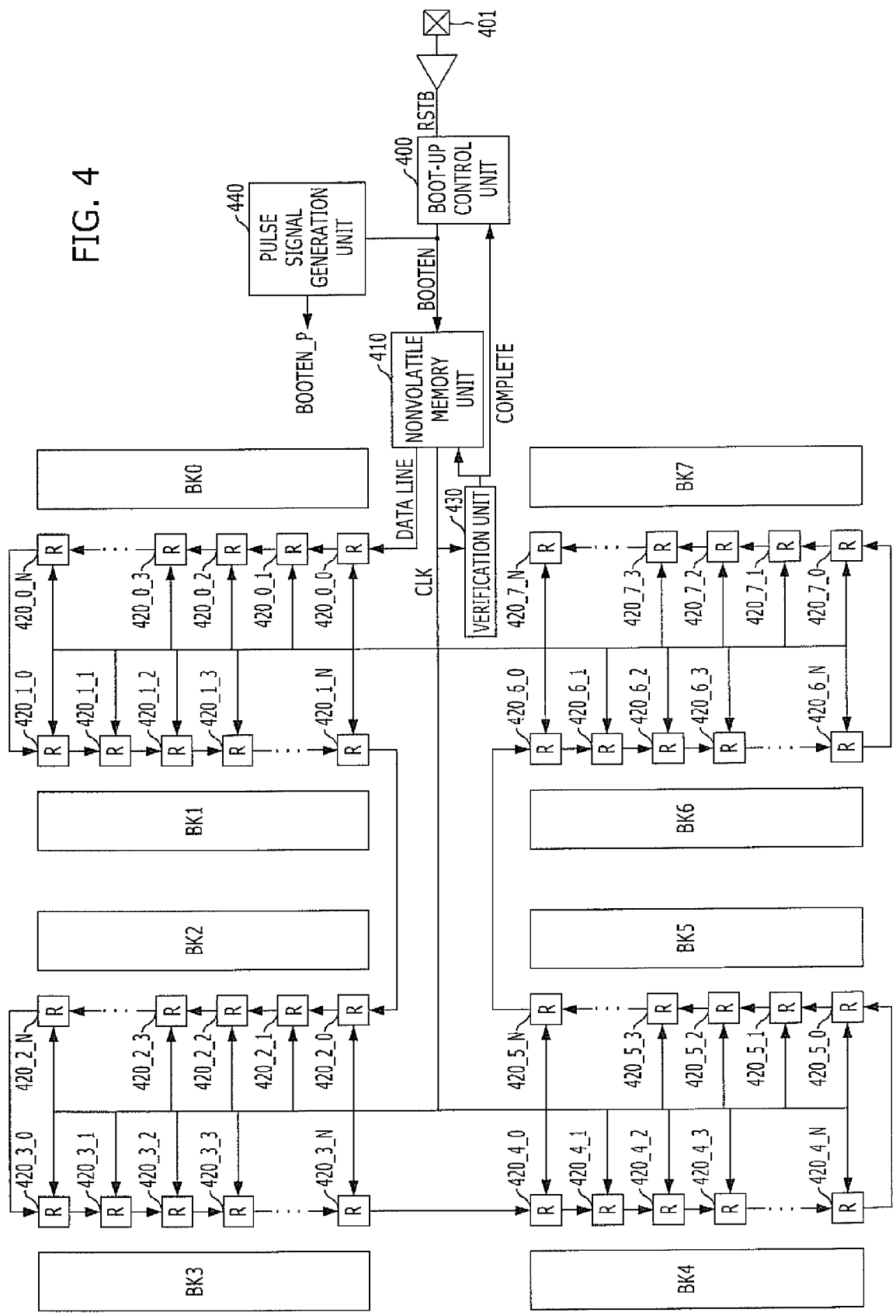
FIG. 4 is a configuration diagram of a memory device in accordance with an embodiment of the present invention.

FIG. 4 is a configuration diagram of the memory device in accordance with the embodiment of the present invention.

Referring to FIG. 4, the memory device includes a boot-up control unit 400, a nonvolatile memory unit 410, a plurality of registers 420_0_0 to 420_7_N, a plurality of memory banks BK0 to BK7, and a verification unit 430.

The boot-up control unit 400 is configured to control a start of boot-up operation whenever an initialization signal RSTB is activated, and ignore the initialization signal RSTB after a complete signal COMPLETE is activated. Specifically, the boot-up control unit 400 activates a boot-up enable signal BOOTEN to start the boot-up operation of the nonvolatile memory unit 410 whenever the initialization signal RSTB is activated. However, once the boot-up operation is completed, the boot-up control unit 400 ignores the reset signal RSTB even though the initialization signal RSTB is activated, and does not activate the boot-up enable signal BOOTEN. FIG. 4 illustrates that a reset signal RSTB inputted from an external source through a pad 401 is used as the initialization signal. However, any signal activated during the initialization operation period of the memory may be used as the initialization signal, instead of the reset signal RSTB.

A pulse signal generation unit 440 is configured to generate a pulse signal BOOTEN_P, which is activated shortly after the activation time point of the boot-up enable signal BOOTEN. Here, the generated pulse signal BOOTEN_P may be used to reset the registers 420_0_0 to 420_7_N.

The nonvolatile memory unit 410 stores repair data of the memory banks BK0 to BK7, that is, an address of memory cells having a defect. The nonvolatile memory unit 410 transmits data through a data line DATA LINE. The nonvolatile memory unit 410 outputs a clock signal CLK generated from an internal oscillator (or generated using a clock signal inputted from an external source), and the clock signal CLK is synchronized with the data of the data line DATA LINE. The nonvolatile memory unit 410 may include an E-fuse array or various nonvolatile memories such as flash memory and EEPROM. The operation of the nonvolatile memory unit 410 is performed while the boot-up enable signal BOOTEN is activated. That is, when the boot-up enable signal BOOTEN is activated, the nonvolatile memory unit 410 transmits stored data to the data line DATA LINE based on a predetermined order in synchronization with the clock signal CLK.

The plurality of registers 420_0_0 to 420_7_N store repair information of the corresponding banks. For example, the registers 420_0_0 to 420_0_N store the repair information of the first memory bank BK0, and the registers 420_5_0 to 420_5_N store the repair information of the sixth memory bank BK5. The plurality of registers 420_0_0 to 420_7_N are connected in series to form one shift register. The plurality of registers 420_0_0 to 420_7_N shift and store the data transmitted to the data line DATA LINE in synchronization with the clock signal CLK. For example, when the clock signal CLK is toggled for the first time, first data transmitted to the data line DATA LINE for the first time is stored in the register 420_0_0. When the clock signal CLK is toggled for the second time, the first data transmitted to the data line DATA LINE (that is, the data stored in the register 420_0_0) is stored in the register 420_0_1, and second data transmitted to the data line DATA LINE for the second time is stored in the register 420_0_0. Each of the registers 420_0_0 to 420_7_N may include a D flip-flop.

The memory banks BK0 to BK7 perform a repair operation of replacing a normal cell with a redundant cell, using the repair data stored in the corresponding registers 420_0_0 to 420_7_N. Each of the memory banks BK0 to BK7 may include a DRAM cell array or FLASH cell array.

The verification unit 430 is configured to verify whether or not the data outputted from the nonvolatile memory unit 410 are stored in all of the registers 420_0_0 to 420_7_N. The verification unit 430 activates the complete signal COMPLETE when a predetermined time passes from the start of operation of the nonvolatile memory unit 410. In other words, the verification unit 430 activates the complete signal COMPLETE when a time required for the nonvolatile memory unit 410 to transmit data to the registers 420_0_0 to 420_7_N passes. The verification unit 430 may be designed to count the number of activations of the clock signal CLK during the activation period of the boot-up enable signal BOOTEN and activate the complete signal COMPLETE when the count reaches a preset value. The count of the verification unit 430 may be reset by the pulse signal BOOTEN_P generated by the pulse signal generation unit 440. Furthermore, the verification unit 430 may transmit the complete signal COMPLETE to the nonvolatile memory unit 410 such that the clock signal CLK outputted from the nonvolatile memory unit 410 is not toggled the complete signal COMPLETE is activated.

Referring to FIG. 4, during the boot-up operation for transmitting the data of the nonvolatile memory unit 410 to the registers 420_0_0 to 420_7_N, the clock signal CLK is transmitted instead of an address, and the registers 420_0_0 to 420_7_N are connected in a shift register type to shift and store the data outputted from the nonvolatile memory unit 410 in synchronization with the clock signal CLK. Therefore, a multi-bit address does not need to be transmitted to the registers 420_0_0 to 420_7_N from the nonvolatile memory unit 410, which may significantly reduce the size and space of the memory device.

Furthermore, the boot-up operation is performed again whenever the initialization signal RSTB is activated. However, after the boot-up operation is completed, the initialization signal RSTB is ignored even though the initialization signal RSTB is activated by mistake. Therefore, it may prevent the boot-up operation from being repetitively performed or imperfectly performed when the initialization signal RSTB is activated by mistake.

Figure 5:
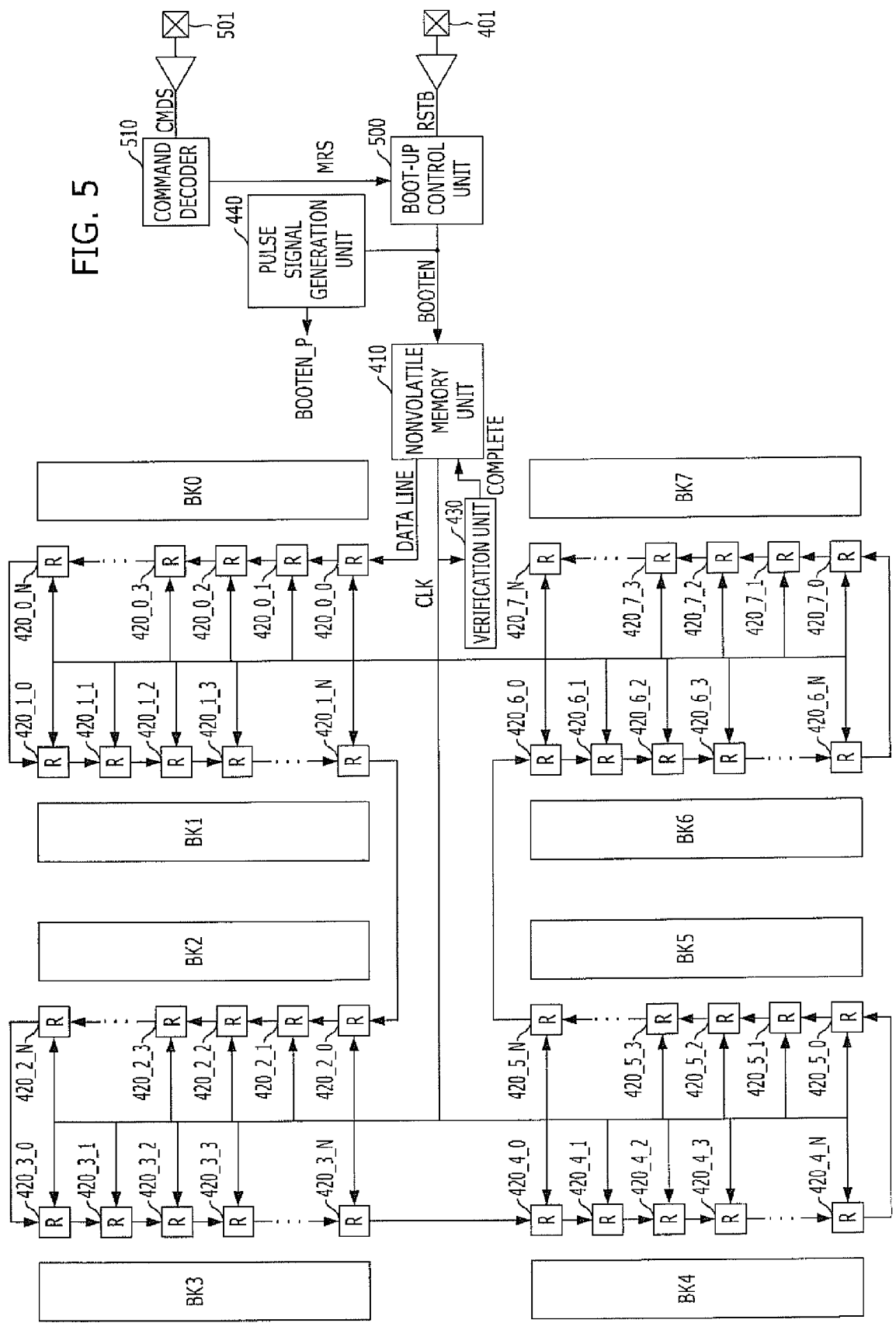
FIG. 5 is a configuration diagram of a memory device in accordance with another embodiment of the present invention.

FIG. 5 is a configuration diagram of a memory device in accordance with another embodiment of the present invention.

The memory device of FIG. 5 is different from the memory device of FIG. 4 in that a boot-up control unit 500 receives a setting command MRS generated from a command decoder 510, instead of the complete signal COMPLETE.

The command decoder 510 is configured to decode command signals applied from an external source through command pads 501 and generate a command. The command generated by the command decoder 510 may include an active command, a precharge command, a read command, a write command, a refresh command, a setting command MRS, and the like. Since the setting command MRS is directly related to the embodiment of present invention, FIG. 5 illustrates only the setting command MRS among various commands.

The boot-up control unit 500 may be designed in the same manner as the boot-up control unit 400 of FIG. 4, except that the boot-up control unit 500 receives the setting command MRS instead of the complete signal COMPLETE. The memory device activates the setting command MRS for performing various setting operations of the memory device after an initialization process, which includes a power-up operation and a reset operation of internal circuits, is completed. After the setting command MRS is activated, a normal operation of the memory device is performed. Therefore, the boot-up operation must be completed before the setting command MRS is applied. Therefore, the boot-up control unit 500 controls the boot-up operation by not performing the operation even though the reset signal RSTB is activated by mistake, under the supposition that the boot-up operation is already normally completed after the setting command MRS is applied.

Since components having the same reference numerals as those of FIG. 5 have been already described above, the detailed descriptions identical or similar components are omitted.

Figure 6:
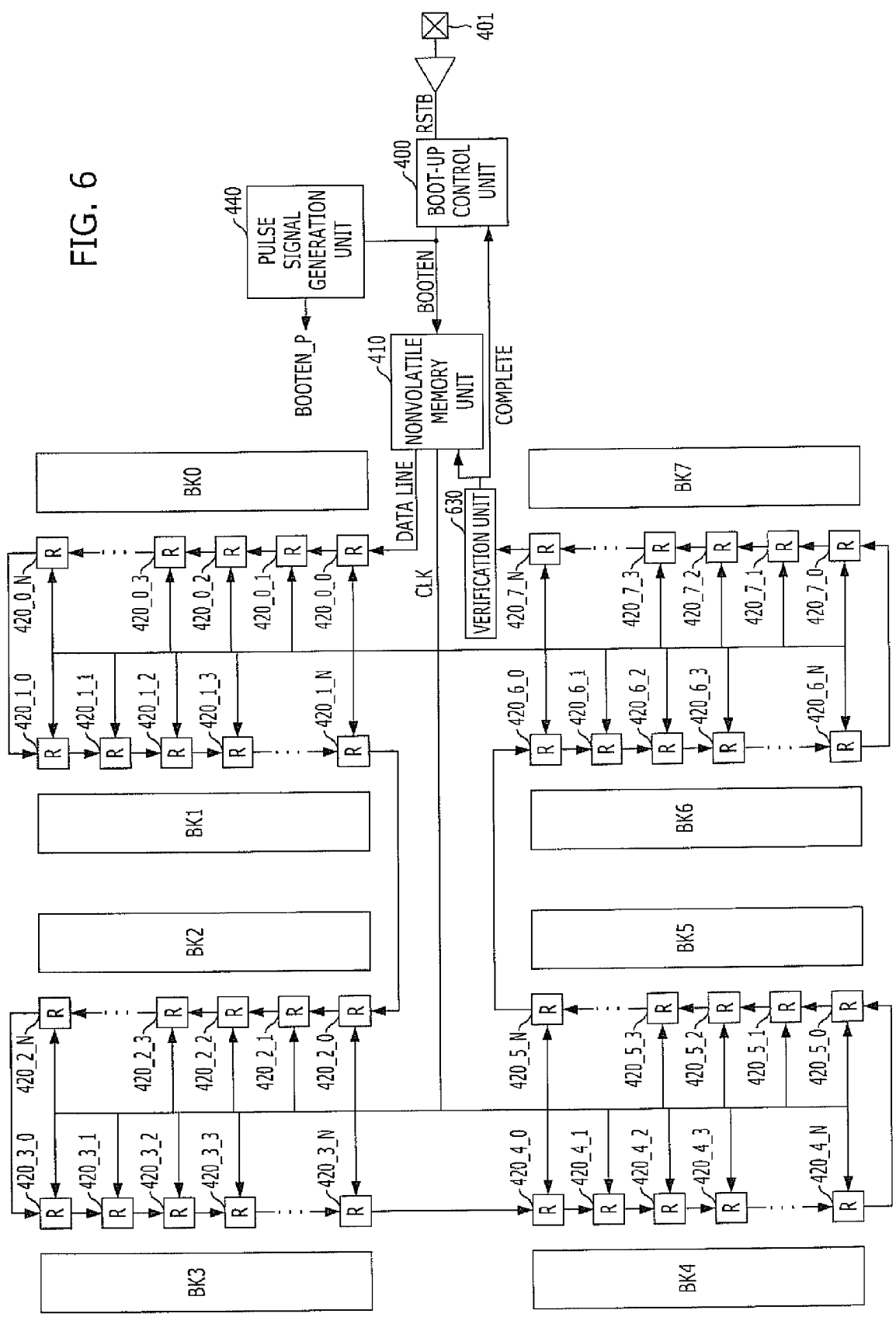
FIG. 6 is a configuration diagram of a memory device in accordance with another embodiment of the present invention.

FIG. 6 is a configuration diagram of a memory device in accordance with another embodiment of the present invention.

The memory device of FIG. 6 generates the complete signal COMPLETE in a manner different from the memory device of FIG. 4.

In FIG. 6, when the boot-up enable signal BOOTEN is activated, the nonvolatile memory unit 410 does not output data, which are to be stored in the plurality of registers 420_0_0 to 420_7_N, but transmits a predetermined data pattern prior to the data to be stored. For example, a four-bit data pattern of '1010' may be outputted from the nonvolatile memory unit 410. A verification unit 630 receives data outputted from the last register 420_7_N forming a shift register. The verification unit 630 checks whether or not the predetermined data pattern is transmitted from the last register, and verifies that all of the data were transmitted to the registers 420_0_0 to 420_7_N from the nonvolatile memory unit 410.

The verification unit 630 and the pulse signal generation unit 610 of FIG. 6 may be applied to the memory device of FIG. 5.

Figure 7:
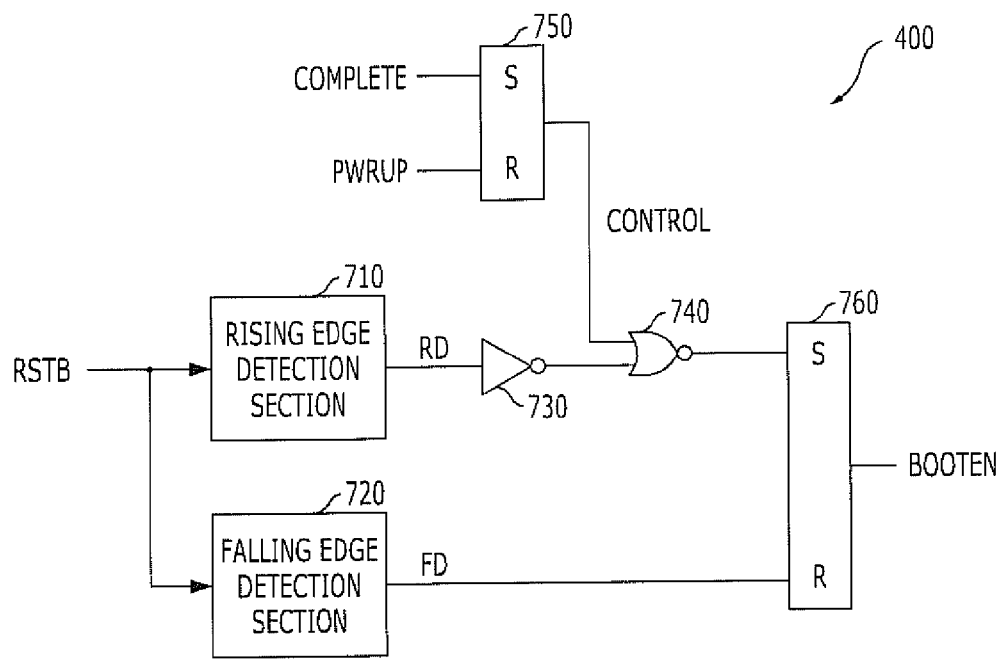
FIG. 7 is a configuration diagram of a boot-up control unit of FIGS. 4 and 6.

FIG. 7 is a configuration diagram of the boot-up control unit 400 of FIGS. 4 and 6.

Referring to FIG. 7, the boot-up control unit 400 includes a rising edge detection section 710, a falling edge detection section 720, an inverter 730, a NOR gate 740, and SR latches 750 and 760.

The rising edge detection section 710 is configured to activate a rising detection signal RD to a high level at a rising edge where the initialization signal RSTB transits from a low level to a high level. Since the initialization signal RSTB is activated to a low level, the rising edge detection section 710 activates the rising detection signal RD at the moment when the initialization signal RSTB is deactivated.

The falling edge detection section 720 activates a falling detection signal FD to a high level at a falling edge where the initialization signal RSTB transits from a high level to a low level. The falling edge detection section 720 activates the falling detection signal FD at the moment when the initialization signal RSTB is activated.

The SR latch 750 uses a complete signal COMPLETE as a set signal and uses a power-up signal PWRUP as a reset signal. The SR latch 750 activates a control signal CONTROL to a high level in response to the activation of complete signal COMPLETE. Alternatively, the SR latch 750 deactivates the control signal CONTROL to a low level in response to the activation of power-up signal PWRUP. Here, the power-up signal PWRUP is activated when internal voltages are stabilized after power-up of the memory device. The control signal CONTROL maintains a deactivated state after power-up of the memory device, and maintains an activated state after the complete signal COMPLETE is activated.

The NOR gate 740 is configured to output the rising detection signal RD while the control signal CONTROL is deactivated, that is, before the boot-up operation is completed. Furthermore, while the control signal CONTROL is activated, that is, after the boot-up operation is completed, the NOR gate 740 always outputs a signal, which is deactivated to a low level, regardless of the level of the rising is detection signal RD.

The SR latch 760 activates the boot-up enable signal BOOTEN to a high level, when the output signal of the NOR gate 740 is activated to a high level. Furthermore, when the falling detection signal FD is activated to a high level, the boot-up enable signal BOOTEN is deactivated to a low level.

The boot-up control unit 500 of FIG. 5 may be designed in the same manner as the boot-up control unit 400 of FIG. 7, except that the boot-up control unit 500 receives the setting command MRS instead of the complete signal COMPLETE.

Figure 8:
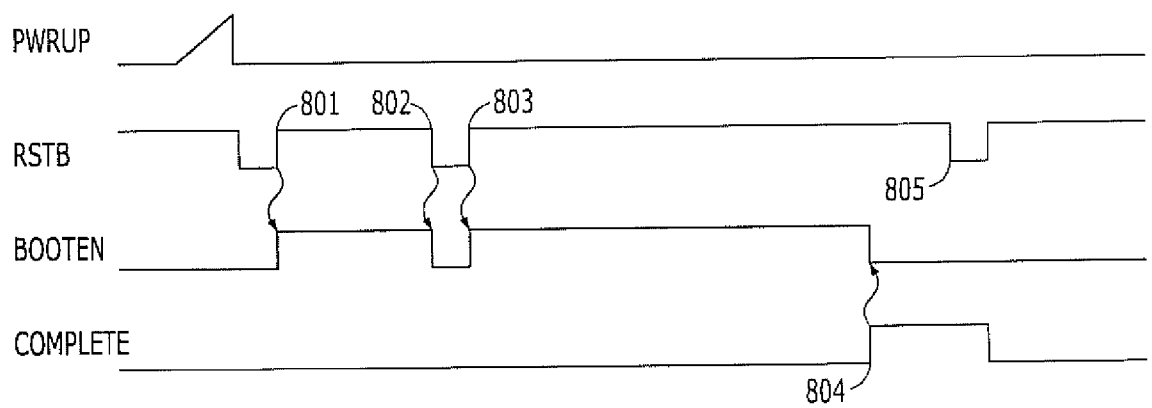
FIG. 8 is a timing diagram illustrating the operation of the boot-up control unit of FIG. 7.

FIG. 8 is a timing diagram illustrating the operation of the boot-up control unit 400 of FIG. 7.

Referring to FIG. 8, the power-up signal PWRUP is activated at the same time when the memory device is started. Then, the control signal CONTROL is deactivated to a low level in response to the power-up signal PWRUP.

Then, when the initialization signal RSTB is activated to a low level and then deactivated to a high level (801), the boot-up enable signal BOOTEN is activated to a high level. When the initialization signal RSTB is activated again to a low level before the boot-up operation is completed (802), the boot-up enable signal BOOTEN is deactivated to a low level. When the initialization signal RSTB is deactivated to a high level (803), the boot-up enable signal BOOTEN is activated to a high level. When the activation period of the boot-up enable signal BOOTEN is sufficiently secured to complete the boot-up operation, the complete signal COMPLETE is activated (804). After the complete signal COMPLETE is activated, the boot-up enable signal BOOTEN is deactivated to a low level, and continuously maintains the state deactivated to a low level, regardless of the activation (805) of the initialization signal RSTB.

In general, the initialization signal such as a reset signal RSTB is activated for only one time during an initialization operation. However, the reset signal RSTB may be activated several times by noises between a memory controller and the memory device. In accordance with the embodiment of the present invention, the boot-up operation is started whenever the reset signal RSTB is activated, but once the boot-up operation is completed, the reset signal RSTB activated afterwards is ignored. Therefore, although the reset signal RSTB is activated several times by mistake, it may prevent an error in which the boot-up operation is repetitively performed.

In the above-described embodiments of the present invention, the present invention is applied to the memory device. However, the present invention may be applied to all types of integrated circuits, which include a nonvolatile memory unit and require a boot-up operation to transmit data stored in the nonvolatile memory unit to registers. Furthermore, it has been described that the data stored in the registers are used for a repair operation through the boot-up operation. However, the data stored in the registers may be used in other various types of internal circuits.

Furthermore, it has been described that, after the boot-up operation is completed or an effective setting command is applied, the boot-up operation is not performed even though the initialization signal is activated. However, the memory device may be designed to perform the boot-up operation again when the initialization signal is activated even after the boot-up operation is completed or an effective setting command is applied in a specific state such as a test mode.

While the present invention has been described with respect to the specific embodiments, it will be apparent to those skilled in the art that various changes and modifications may be made without departing from the spirit and scope of the invention as defined in the following claims.

What is claimed is:

1. A memory device comprising:
a boot-up control unit configured to control a start of boot-up operation by starting the boot-up operation when an initialization signal is activated, and ignore the initialization signal after a complete signal is activated;
a nonvolatile memory unit configured to store repair data, and output the stored repair data during the boot-up operation;
a plurality of registers configured to store the repair data outputted from the nonvolatile memory unit;
a plurality of memory banks configured to replace a normal cell with a redundant cell, using the repair data stored in the corresponding registers among the plurality of resistors; and
a verification unit configured to generate the complete signal to notify that the boot-up operation is completed.

2. The memory device of claim 1, wherein the initialization signal comprises a reset signal.

3. The memory device of claim 1, wherein the boot-up control unit activates a boot-up enable signal when the initialization signal transits from an activated state to a deactivated state, deactivates the boot-up enable signal when the initialization signal transits from a deactivated state to an activated state, and maintains the boot-up enable signal in a deactivated state regardless of the initialization signal, after the complete signal is activated.

4. The memory device of claim 3, wherein the nonvolatile memory unit outputs the stored repair data during the activation period of the boot-up enable signal.

5. The memory device of claim 1, wherein the plurality of registers are connected in a shift register type, and shift and store the repair data outputted from the nonvolatile memory unit in synchronization with a clock signal.

6. The memory device of claim 5, wherein the nonvolatile memory unit initially transmits a predetermined data pattern, and
the verification unit verifies that the predetermined data pattern is outputted from the last register among the plurality of registers, and generates the complete signal.

7. The memory device of claim 3, wherein the verification unit activates the complete signal after a preset time passes from the activation of the boot-up enable signal.

8. An integrated circuit comprising:
a boot-up control unit configured to control a start of boot-up operation by starting the boot-up operation when an initialization signal is activated, and ignore the initialization signal after a complete signal is activated;

a nonvolatile memory unit configured to output data stored therein during the boot-up operation;

a plurality of registers configured to store the data outputted from the nonvolatile memory unit;

an internal circuit configured to use the data stored in the plurality of registers; and a verification unit configured to generate the complete signal to notify that the boot-up operation is completed.

9. The integrated circuit of claim 8, wherein the boot-up control unit activates a boot-up enable signal when the initialization signal transits from an activated state to a deactivated state, deactivates the boot-up enable signal when the initialization signal transits from a deactivated state to an activated state, and maintains the boot-up enable signal in a deactivated state regardless of the initialization signal, after the complete signal is activated.

10. The memory device of claim 9, wherein the nonvolatile memory unit outputs the stored repair data during the activation period of the boot-up enable signal.

11. The memory device of claim 8, wherein the plurality of registers are connected in a shift register type, and shift and store the data outputted from the nonvolatile memory unit in synchronization with a clock signal.

12. The memory device of claim 11, wherein the nonvolatile memory unit initially transmits a predetermined data pattern, and the verification unit verifies that the predetermined data pattern is outputted from the last register among the plurality of registers, and generates the complete signal.

13. The memory device of claim 9, wherein the verification unit activates the complete signal after a preset time passes from the activation time point of the boot-up enable signal.

* * * * *